US012669557B2

(12) United States Patent
Finck et al.

(10) Patent No.: US 12,669,557 B2
(45) Date of Patent: Jun. 30, 2026

(54) QUBIT-TO-QUBIT INTERACTIONS MEDIATED BY PAIRS OF RESONATORS WITH TUNABLE INDUCTIVE COUPLING

(71) Applicant: International Business Machines Corporation, Armonk, NY (US)

(72) Inventors: Aaron Finck, White Plains, NY (US); Muir Kumph, Croton on Hudson, NY (US); David Zajac, Valley Cottage, NY (US); Jiri Stehlik, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 155 days.

(21) Appl. No.: 18/621,077

(22) Filed: Mar. 28, 2024

(65) Prior Publication Data

US 2025/0306136 A1      Oct. 2, 2025

(51) Int. Cl.
| | |
|---|---|
| *G01R 33/035* | (2006.01) |
| *G06N 10/40* | (2022.01) |
| *H10N 60/12* | (2023.01) |

(52) U.S. Cl.
CPC ..... *G01R 33/0358* (2013.01); *G01R 33/0356* (2013.01); *G06N 10/40* (2022.01); *H10N 60/12* (2023.02)

(58) Field of Classification Search
CPC ...... G01R 33/00; G01R 33/02; G01R 33/035; G01R 33/0354; G01R 33/0356; G01R 33/0358; G01R 33/20; G06N 10/40; H10N 60/12

USPC ................................. 324/629, 630, 201, 248
See application file for complete search history.

(56) References Cited

U.S. PATENT DOCUMENTS

| | | | |
|---|---|---|---|
| 11,188,843 B2 | 11/2021 | Barzegar et al. | |
| 11,494,683 B2 | 11/2022 | Amin et al. | |
| 2015/0028970 A1* | 1/2015 | Chow | H01P 7/00 |
| | | | 333/205 |
| 2017/0193388 A1* | 7/2017 | Filipp | G06N 10/40 |
| 2019/0019098 A1* | 1/2019 | Przybysz | G11C 11/44 |
| 2021/0241160 A1 | 8/2021 | Amin et al. | |
| 2022/0138611 A1 | 5/2022 | Siddiqi et al. | |

OTHER PUBLICATIONS

Campbell et al., "Modular Tunable Coupler for Superconducting Circuits" Physical Review Applied 19, 064043 (2023), Jun. 13, 2023, 17 pages.

(Continued)

*Primary Examiner* — Lee E Rodak
*Assistant Examiner* — Taqi R Nasir
(74) *Attorney, Agent, or Firm* — Amin, Turocy & Watson, LLP

(57) ABSTRACT

A qubit interaction circuit includes a first qubit device, a second qubit device, a first resonator, a second resonator, a first capacitor coupling the first qubit device to the first resonator and a second capacitor coupling the second qubit device to the second resonator. An rf-SQUID circuit includes an rf-SQUID loop, an rf-SQUID controller, and a dc-SQUID loop. The rf-SQUID controller is configured to influence a first flux of the rf-SQUID loop and the dc-SQUID loop, the rf-SQUID circuit coupling the first resonator with the second resonator. A dc-SQUID controller is configured to influence a second flux of the rf-SQUID loop and the dc-SQUID loop.

20 Claims, 6 Drawing Sheets

(56) References Cited

OTHER PUBLICATIONS

Goto, "Double-Transmon Coupler: Fast Two-Qubit Gate with No. Residual Coupling for Highly Detuned Superconducting Qubits", arXiv:2203.11451v2 [quant-ph] Sep. 27, 2022, 10 pages.

Poletto et al., "A Tunable rf SQUID Manipulated as Flux and Phase Qubit", arXiv:0910.4562v1 [cond-mat.supr-con] Oct. 23, 2009, 12 pages.

Wang et al., "Control the Qubit-Qubit Coupling in the Superconducting Circuit with Double-Resonator Couplers", arXiv:2304.10047v1 [quant-ph] Apr. 20, 2023, 19 pages.

Wulschner et al., "Tunable Coupling of Transmission-Line Microwave Resonators Mediated by an rf SQUID", arXiv:1508.06758v2 [cond-mat.supr-con] Aug. 28, 2015, 6 pages.

* cited by examiner

J Between Q2 and Q3
when Q1-Q2 Coupler is on:

m2
Freq=5.000 GHz
J48=0.022

J Between Q1 and Q3
when Q1-Q2 Coupler is on:

m1
Freq=5.000 GHz
J38=0.010

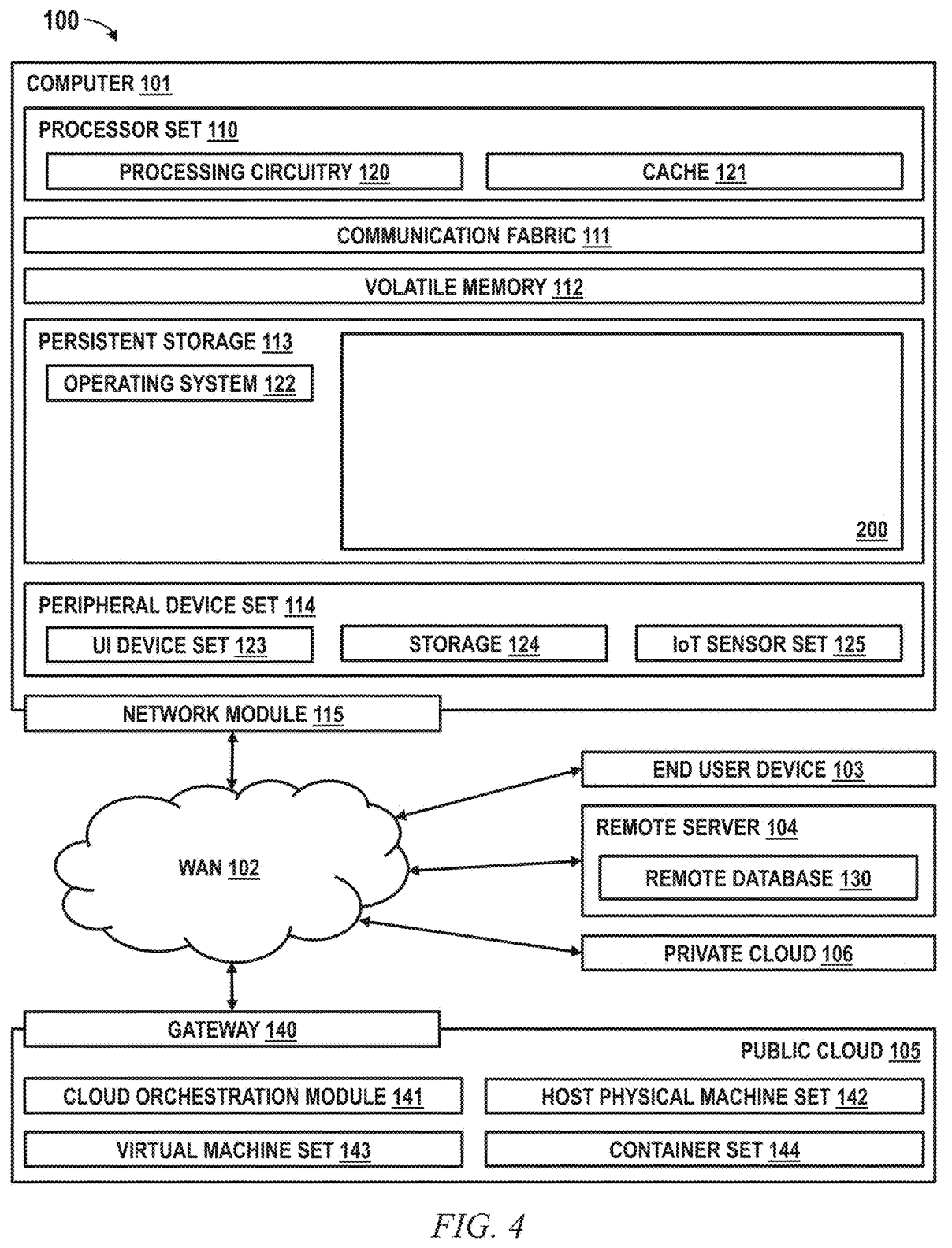

100

COMPUTER 101

PROCESSOR SET 110

PROCESSING CIRCUITRY 120          CACHE 121

COMMUNICATION FABRIC 111

VOLATILE MEMORY 112

PERSISTENT STORAGE 113

OPERATING SYSTEM 122

200

PERIPHERAL DEVICE SET 114

UI DEVICE SET 123          STORAGE 124          IoT SENSOR SET 125

NETWORK MODULE 115

WAN 102

END USER DEVICE 103

REMOTE SERVER 104

REMOTE DATABASE 130

PRIVATE CLOUD 106

GATEWAY 140

PUBLIC CLOUD 105

CLOUD ORCHESTRATION MODULE 141          HOST PHYSICAL MACHINE SET 142

VIRTUAL MACHINE SET 143          CONTAINER SET 144

*FIG. 4*

QUBIT-TO-QUBIT INTERACTIONS MEDIATED BY PAIRS OF RESONATORS WITH TUNABLE INDUCTIVE COUPLING

BACKGROUND

The present invention relates generally to the electrical, electronic and computer arts and, more particularly, to quantum computing.

Double-transmon couplers, inductive couplers and the like have been proposed for enabling qubit-to-qubit interactions on qubit chips. Such qubit-to-qubit interactions, however, are often limited by adverse effects, including crosstalk and unwanted interactions with spectator qubits. For example, conventional techniques often suffer from crosstalk and unwanted interactions with spectator qubits that limit the attainable length of the qubit-to-qubit interactions.

BRIEF SUMMARY

Principles of the invention provide techniques for qubit-to-qubit interactions mediated by pairs of resonators with tunable inductive coupling. In one aspect, an exemplary method includes the operations of iteratively tuning a flux of a de-SQUID loop and tuning a flux of an rf-SQUID loop to half of a magnetic flux quantum such that an inductance of the rf-SQUID loop is cancelled out by an inductance of the de-SQUID loop and such that an Off state between two qubit devices is attained with a non-hysteretic regime, the de-SQUID loop and the rf-SQUID loop being coupled to the two qubit devices via corresponding resonators; and performing an additional tuning of the flux of the rf-SQUID loop such that the corresponding resonators couple and hybridize with each other, and such that an On state between the two qubit devices is attained.

In one aspect, a qubit interaction circuit comprises a first qubit device, a second qubit device, a first resonator, a second resonator, a first capacitor coupling the first qubit device to the first resonator, and a second capacitor coupling the second qubit device to the second resonator; an rf-SQUID circuit comprising an rf-SQUID loop, an rf-SQUID controller, and a de-SQUID loop, the rf-SQUID controller configured to influence a first flux of the rf-SQUID loop and the dc-SQUID loop, the rf-SQUID circuit coupling the first resonator with the second resonator; and a dc-SQUID controller configured to influence a second flux of the rf-SQUID loop and the dc-SQUID loop.

In one aspect, a hardware description language (HDL) design structure is encoded on a machine-readable data storage medium, the HDL design structure comprising elements that when processed in a computer-aided design system generates a machine-executable representation of a semiconductor structure, wherein the HDL design structure comprises a first qubit device, a second qubit device, a first resonator, a second resonator, a first capacitor coupling the first qubit device to the first resonator, and a second capacitor coupling the second qubit device to the second resonator; an rf-SQUID circuit comprising an rf-SQUID loop, an rf-SQUID controller, and a dc-SQUID loop, the rf-SQUID controller configured to influence a first flux of the rf-SQUID loop and the dc-SQUID loop, the rf-SQUID circuit coupling the first resonator with the second resonator; and a dc-SQUID controller configured to influence a second flux of the rf-SQUID loop and the dc-SQUID loop.

As used herein, "facilitating" an action includes performing the action, making the action easier, helping to carry the action out, or causing the action to be performed. Thus, by way of example and not limitation, instructions executing on a processor might facilitate an action carried out by semiconductor fabrication equipment, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects, as will be discussed further below. Features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 4 depicts a computing environment according to an embodiment of the present invention.

Figure 1:
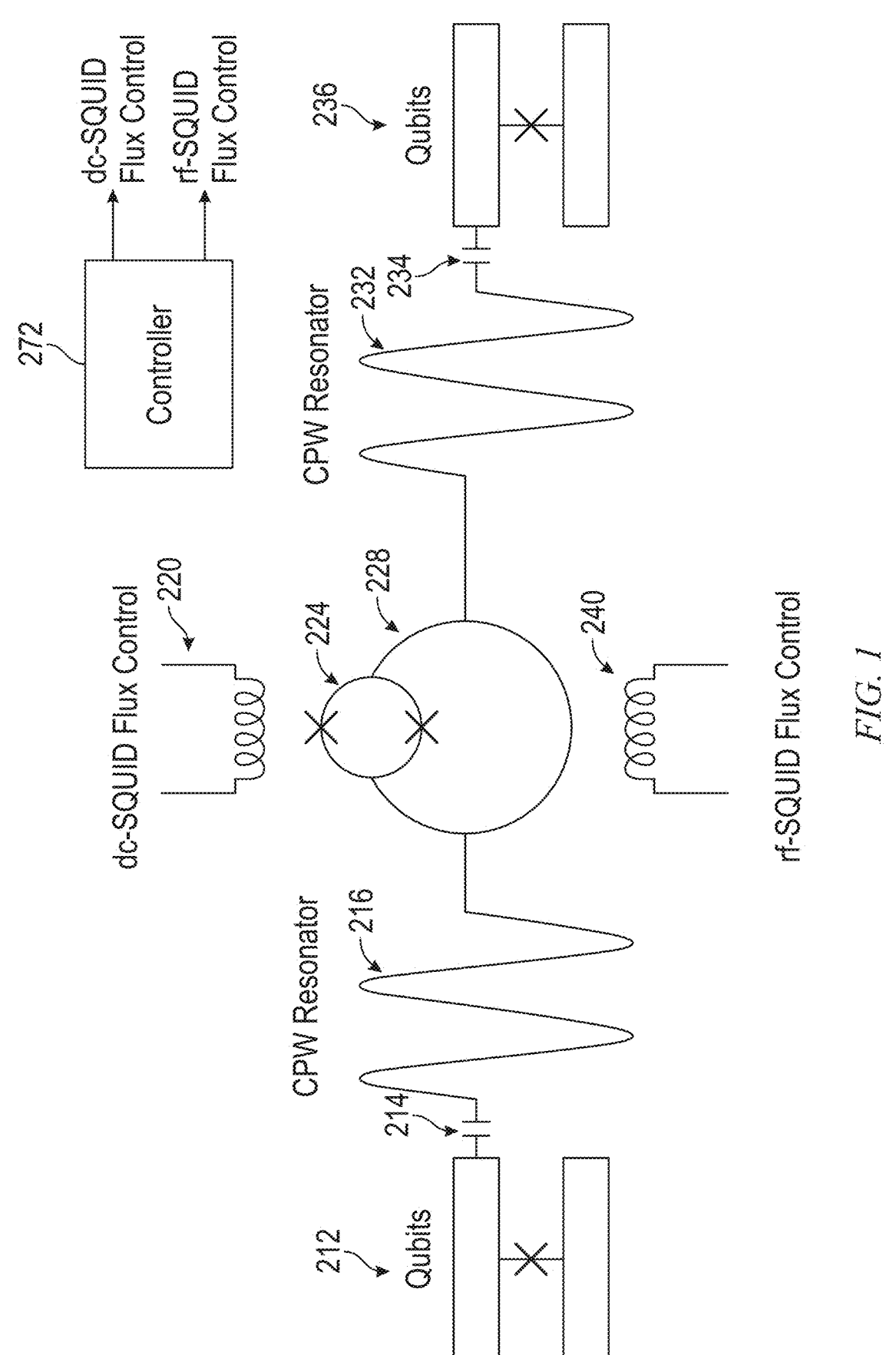
FIG. 1 illustrates an example double resonator coupler circuit for providing long-range interactions between qubits, in accordance with an example embodiment.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Given the discussion herein (reference characters refer to the drawings discussed below), it will be appreciated that, in general terms, an exemplary method, according to an aspect of the invention, includes the operations of iteratively tuning a flux of a dc-SQUID loop 224 and tuning a flux of an rf-SQUID loop 228 to half of a magnetic flux quantum such that an inductance of the rf-SQUID loop 228 is cancelled out by an inductance of the dc-SQUID loop 224 and such that an Off state between two qubit devices 212, 236 is attained with a non-hysteretic regime, the dc-SQUID loop 224 and the rf-SQUID loop 228 being coupled to the two qubit devices 212, 236 via corresponding resonators 216, 232; and performing an additional tuning of the flux of the rf-SQUID loop 228 such that the corresponding resonators 216, 232 couple and hybridize with each other, and such that an On state between the two qubit devices 212, 236 is attained. This feature provides the technical benefits of mechanisms for long-range interactions that suppress crosstalk and suppressed spectator errors in quantum computers and mechanisms for the creation of a scalable quantum computer.

In one aspect, a qubit interaction circuit comprises a first qubit device 212, a second qubit device 236, a first resonator 216, a second resonator 232, a first capacitor 214 coupling the first qubit device 212 to the first resonator 216, and a second capacitor 234 coupling the second qubit device 236 to the second resonator 232; an rf-SQUID circuit comprising an rf-SQUID loop 228, an rf-SQUID controller 240, and a dc-SQUID loop 224, the rf-SQUID controller 240 configured to influence a first flux of the rf-SQUID loop 228 and the dc-SQUID loop 224, the rf-SQUID circuit coupling the first resonator 216 with the second resonator 232; and a dc-SQUID controller 220 configured to influence a second flux of the rf-SQUID loop 228 and the dc-SQUID loop 224. This feature provides the technical benefits of mechanisms for long-range interactions that suppress crosstalk and suppressed spectator errors in quantum computers and mechanisms for the creation of a scalable quantum computer.

In one example embodiment, a flux of an rf-SQUID loop 228 is iteratively tuned to $\frac{1}{2}$ $\Phi_0$ such that an inductance of the rf-SQUID loop 228 is cancelled out by an inductance of the dc-SQUID loop 224 and such that an Off state between two qubit devices 212, 236 is attained with a non-hysteretic regime, the dc-SQUID loop 224 and the rf-SQUID loop 228 being coupled to the two qubit devices 212, 236 via a corresponding one of the first resonator 216 and the second resonator 232; and an additional tuning of the flux of the rf-SQUID loop 228 is performed such that the corresponding resonators 216, 232 couple and hybridize with each other, and such that an On state between the two qubit devices 212, 236 is attained. This feature provides the technical benefits of iteratively tuning a flux of an rf-SQUID loop 228 such that an inductance of the rf-SQUID loop 228 is cancelled out by an inductance of the dc-SQUID loop 224 and such that an Off state between two qubit devices 212, 236 is attained with a non-hysteretic regime, such that the corresponding resonators 216, 232 couple and hybridize with each other, and such that an On state between the two qubit devices 212, 236 is attained.

In one example embodiment, the dc-SQUID controller 220 is configured to iteratively tune a flux of a dc-SQUID loop 224 such that an inductance of the rf-SQUID loop 228 is cancelled out by an inductance of the dc-SQUID loop 224 and such that an Off state between two qubit devices 212, 236 is attained with a non-hysteretic regime, the dc-SQUID loop 224 and the rf-SQUID loop 228 being coupled to the two qubit devices 212, 236 via a corresponding one of the first resonator 216 and the second resonator 232. This feature provides the technical benefits of iteratively tuning a flux of a dc-SQUID loop 224 such that an inductance of the rf-SQUID loop 228 is cancelled out by an inductance of the dc-SQUID loop 224 and such that an Off state between two qubit devices 212, 236 is attained with a non-hysteretic regime.

In one example embodiment, the qubit devices 212, 236 are transmon qubits. This feature provides the technical benefit of mechanisms for long-range interactions that suppress crosstalk and suppressed spectator errors in quantum computers and mechanisms for the creation of a scalable quantum computer, realized using transmon qubits.

In one example embodiment, the qubit devices 212, 236 are fluxonium qubits. This feature provides the technical benefit of mechanisms for long-range interactions that suppress crosstalk and suppressed spectator errors in quantum computers and mechanisms for the creation of a scalable quantum computer, realized using fluxonium qubits.

In one example embodiment, the qubit devices 212, 236 are capacitively shunted flux qubit (CSFQ) qubits. This feature provides the technical benefit of mechanisms for long-range interactions that suppress crosstalk and suppressed spectator errors in quantum computers and mechanisms for the creation of a scalable quantum computer, realized using capacitively shunted flux qubit (CSFQ) qubits.

In one example embodiment, the qubit interaction circuit further comprises a third qubit device 260; a third resonator 244; a fourth resonator 256; a third capacitor 264 coupling the second qubit device 236 to the third resonator 244; a fourth capacitor 268 coupling the third qubit device 260 to the fourth resonator 256; a second rf-SQUID circuit comprising a second rf-SQUID loop 252, a second rf-SQUID controller 280, and a second dc-SQUID loop 248, the second rf-SQUID controller 280 being configured to influence a first flux of the second rf-SQUID loop 252 and the second dc-SQUID loop 248, the rf-SQUID circuit coupling the third resonator 244 with the fourth resonator 256; and a second dc-SQUID controller 276 configured to influence a second flux of the rf-SQUID loop 252 and the second dc-SQUID loop 248. This feature provides the technical benefit of extending the technical solution to a plurality of qubit circuits.

In one example embodiment, the qubit interaction circuit further comprises a controller 272, the controller 272 being coupled to the rf-SQUID flux control 240 and the dc-SQUID flux control 220 and configured to iteratively tune a flux of a dc-SQUID loop 224 and tune a flux of an rf-SQUID loop 228 to half of a magnetic flux quantum such that an inductance of the rf-SQUID loop 228 is cancelled out by an inductance of the dc-SQUID loop 224 and such that an Off state between two qubit devices 212, 236 is attained with a non-hysteretic regime, the dc-SQUID loop 224 and the rf-SQUID loop 228 being coupled to the two qubit devices 212, 236 via corresponding resonators 216, 232; and perform an additional tuning of the flux of the rf-SQUID loop 228 such that the corresponding resonators 216, 232 couple and hybridize with each other, and such that an On state between the two qubit devices 212, 236 is attained. This feature provides the technical benefit of a controller for implementing the iterative tuning of the flux of the dc-SQUID loop 224 and the tuning of the flux of the rf-SQUID loop 228.

In one example embodiment, the controller 272 is further configured to select a sign of a dc-SQUID controller 220 and a sign of an rf-SQUID controller 240 such that the flux in the rf-SQUID loop 228 reverts to the non-hysteretic regime in response to the additional tuning of the flux of the rf-SQUID loop 228 changing the flux in the dc-SQUID loop 224 and thereby causing the flux in the rf-SQUID loop 228 to revert to the hysteretic regime. This feature provides the technical benefit of ensuring that the flux in the rf-SQUID loop 228 reverts to the non-hysteretic regime in response to the additional tuning of the flux of the rf-SQUID loop 228 changing the flux in the dc-SQUID loop 224 and thereby causing the flux in the rf-SQUID loop 228 to revert to the hysteretic regime.

In one example embodiment, the selection of the signs causes a magnitude of the flux in the dc-SQUID loop 224 to increase and causes a further reduction of a screening parameter that is indicative of the non-hysteretic regime. This feature provides the technical benefit of supporting a non-hysteretic regime.

In one example embodiment, the controller 272 is further configured to tune a coupling between the corresponding resonators 216, 232 to zero. This feature provides the technical benefit of being able to isolate resonators when desired.

In one example embodiment, one of a plurality of normal modes of the hybridized resonators 216, 232 moves up in frequency, close to that of a frequency of the two qubit devices 212, 236, increasing an exchange coupling between the two qubit devices 212, 236 and turning on ZZ coupling between the two qubit devices 212, 236. This feature provides the technical benefit of increasing the exchange coupling between the two qubit devices 212, 236 and turning on ZZ coupling between the two qubit devices 212, 236.

In one example embodiment, the controller 272 is further configured to control ZZ between the first qubit device 212 and the second qubit device 236 to enable a CPHASE gate. This feature provides the technical benefit of enabling a controlled-phase (CPHASE) gate. It is noted that turning on ZZ crosstalk between qubits 212, 236 with the coupler can be viewed as generating a Z rotation of one qubit 212 that is conditioned on the state of the second qubit 236. The skilled artisan will recognize that a plethora of couplers are available that create a CPHASE gate by controlling the ZZ crosstalk between qubits 212, 236.

In one aspect, a hardware description language (HDL) design structure is encoded on a machine-readable data storage medium, the HDL design structure comprising elements that when processed in a computer-aided design system generates a machine-executable representation of a semiconductor structure, wherein the HDL design structure comprises a first qubit device 212, a second qubit device 236, a first resonator 216, a second resonator 232, a first capacitor 214 coupling the first qubit device 212 to the first resonator 216, and a second capacitor 234 coupling the second qubit device 236 to the second resonator 232; an rf-SQUID circuit comprising an rf-SQUID loop 228, an rf-SQUID controller 240, and a dc-SQUID loop 224, the rf-SQUID controller 240 configured to influence a first flux of the rf-SQUID loop 228 and the dc-SQUID loop 224, the rf-SQUID circuit coupling the first resonator 216 with the second resonator 232; and a dc-SQUID controller 220 configured to influence a second flux of the rf-SQUID loop 228 and the dc-SQUID loop 224. This feature provides the technical benefits of mechanisms for long-range interactions that suppress crosstalk and suppressed spectator errors in quantum computers and mechanisms for the creation of a scalable quantum computer.

Techniques as disclosed herein can provide substantial beneficial technical effects. Some embodiments may not have these potential advantages and these potential advantages are not necessarily required of all embodiments. By way of example only and without limitation, one or more embodiments can provide one or more of:

mechanisms for long-range interactions that suppress crosstalk and suppressed spectator errors in quantum computers;

mechanisms for the creation of a scalable quantum computer;

high on/off ratios and enablement of highly tunable, long-range interaction between distant qubits; and enablement of a controlled-phase (CPHASE) gate.

Generally, circuits and techniques are provided for implementing interactions within a qubit chip, including long-range interactions, while robustly suppressing spectator effects in a superconducting quantum computer. In one example embodiment, coplanar waveguide (CPW) resonators mediate the interactions. (As used herein, resonators include coplanar waveguide resonators, coax cables and other linear resonators capable of connecting spatially separated qubits; the use of coax cables and other linear resonators capable of connecting spatially separated qubits is also contemplated.) Coplanar waveguide resonators can offer long-range interactions (e.g. from about two millimeters to tens of millimeters) within a qubit chip; however, achieving high on/off ratios of interactions between the qubits and controlling unwanted interactions with spectator qubits is not straightforward. Quickly turning interactions on and off, as is necessary for two-qubit gates, is also not straightforward with resonators.

In one example embodiment, pairs of coplanar waveguide resonators are coupled together with a radio frequency superconducting quantum interference device (rf-SQUID), which offers tuneable inductive coupling. Each of the resonators is capacitively coupled to a superconducting qubit. Tuning the rf-SQUID to its half-flux-quantum point turns off the coupling between the two resonators and thus turns off interactions between the qubits. Tuning away from the off-point causes the resonators to hybridize with each other, turning on interaction between the two qubits. One or more exemplary embodiments provide high on/off ratios and enable highly tuneable, long-range interaction between distant qubits.

As is known in the art, an rf-SQUID is a single Josephson junction (JJ) imbedded in a superconducting loop or inductor. Its total inductance can be tuned by threading magnetic flux within the loop. It will exhibit hysteretic behavior if the screening parameter is greater than one, that is, if $$\beta_L = \frac{2\pi}{\Phi_0} LI_0 > 1,$$

where L is the loop's inductance, $I_0$ is the JJ's critical current, and $\Phi_0$ is the magnetic flux quantum.

FIG. 1 illustrates an example double resonator coupler circuit for providing long-range interactions between qubits 212, 236, in accordance with an example embodiment. A second Josephson junction is added to an rf-SQUID that includes loop 228 and an rf-SQUID flux control 240 (which controls the flux within the loop 228) to incorporate a de-SQUID that provides an additional flux control via loop 224. (The de-SQUID includes a de-SQUID flux control 220 that controls the additional flux provided by loop 224.) The rf-SQUID is inductively coupled to CPW resonators 216, 232, as illustrated. Each CPW resonator 216, 232 is capacitively coupled to a corresponding qubit 212, 236 by a corresponding capacitor 214, 234. Qubits 212, 236 can be any type of qubit that is capable of being capacitively-coupled to the CPW resonators 212, 236, including transmon qubits, fluxonium qubits, capacitively shunted flux qubit (CSFQ) qubits, and the like. Typical parameters of the structure of FIG. 1 include transmon frequencies of 4.5-5.5 gigahertz (GHz), CPW resonator frequencies (lambda/2 mode) of 3.5-4 GHZ, transmon-resonator exchange couplings of 100 megahertz (MHz) and an rf-SQUID loop inductance of L~3-5 nanohenry (nH). SQUID loop inductance can be, for example, in the range of 0.1 nH to 10 nH.

One or more embodiments further include a controller 272 that is coupled to the rf-SQUID flux control 240 and the de-SQUID flux control 220. The controller 272 is configured to control the flux within the loop 228 and control the additional flux provided by loop 224, as described above. Controller 272 carries out functions as defined herein; given the teachings and description of the functions herein, known control circuit technologies can be employed; e.g., multicycle or pipelined, hardwired or microprogrammed, using any suitable technology family (e.g., 7 nm CMOS, 5 NM CMOS, and the like). For example, the specified functions can be instantiated in logic circuitry as described below with respect to FIG. 5.

Figure 2:
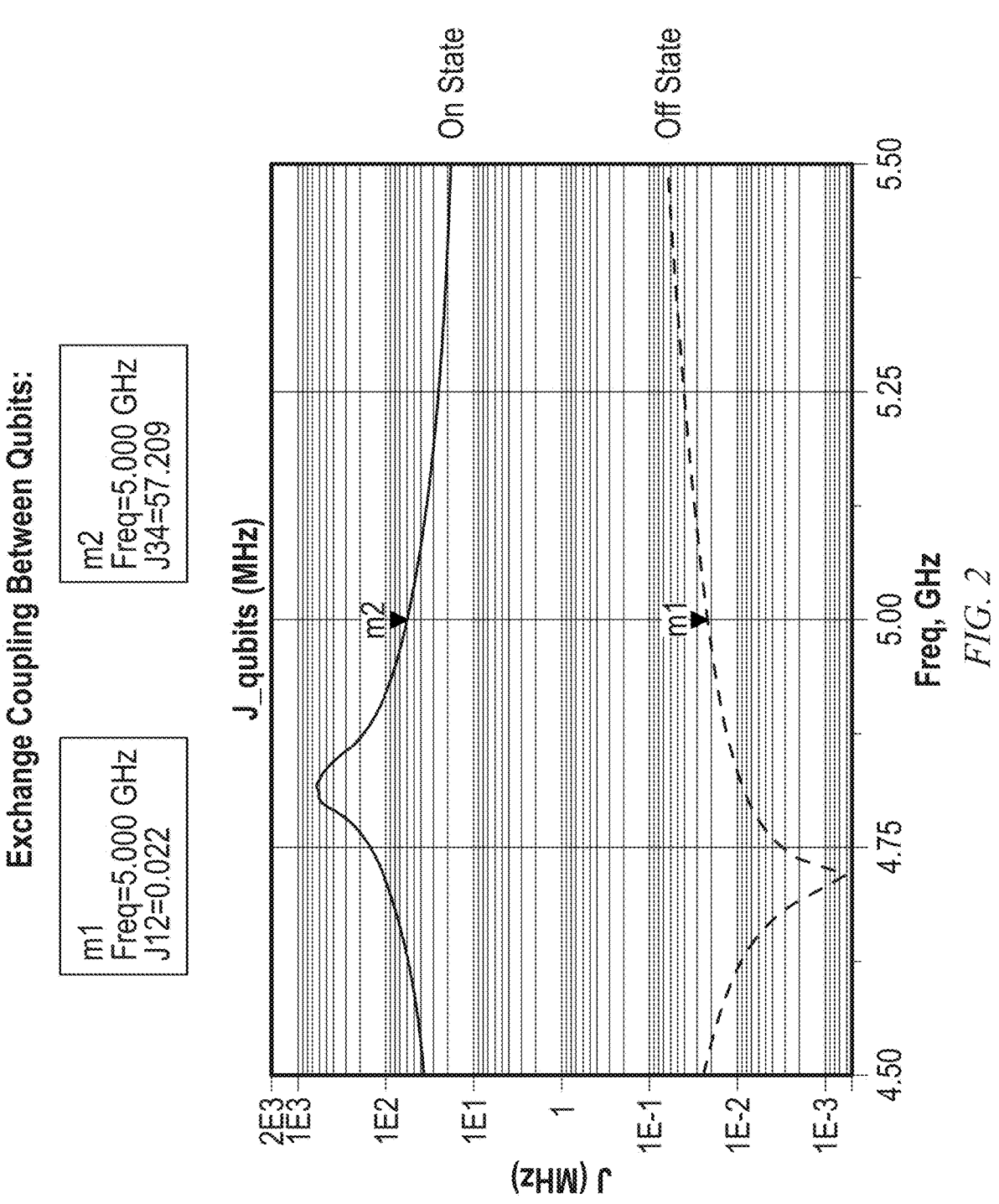
FIG. 2 illustrates the exchange coupling (J parameter) between two qubits for a range of qubit frequencies, in accordance with an example embodiment.

FIG. 2 illustrates the exchange coupling (J parameter) between two qubits 212, 236 for a range of qubit frequencies, in accordance with an example embodiment. The solid line shows that, when the double resonator coupler shifted to the on state, m2 is approximately 50 MHz; the dashed line shows that, when the double resonator coupler shifted to the off state, m1 is 22 KHz.

To achieve the Off state between the transmon qubits 212, 236, the de-SQUID flux is tuned so that $\beta_L \approx 1$ and the rf-SQUID flux is tuned to $$\frac{1}{2}\Phi_0$$

so that the inductance of the loop 228 is cancelled out by the inductance of the de-SQUID loop 224. Coupling between the two resonators 216, 232 is thus tuned to zero.

To achieve the On state, the flux in the rf-SQUID loop 228 is tuned so that the two resonators 216, 232 couple and hybridize with each other. One of the normal modes of the hybridized resonators 216, 232 will move up in frequency, close to that of the qubits 212, 236, greatly increasing the exchange coupling between the qubits 212, 236 and turning on ZZ coupling between them. This enables a controlled-phase (CPHASE) gate.

Stray capacitive coupling between the resonators 216, 232 (included in simulation, where C~10 femtofarad (fF)) will shift the Off point slightly and give some slight frequency dependence of the interaction between the qubits 212, 236. There is only a single J=0 point, but there is still a broad suppression of interaction between the qubits 212, 236.

While there will inevitably be crosstalk between the flux control of the de-SQUID loop 224 and the flux control of the rf-SQUID loop 228, this can be mitigated by adjusting both flux controls 220, 240 iteratively in order to reach an Off state near $\beta_L=1$.

Tuning the rf-SQUID flux to sweep to the On state might change the flux in the de-SQUID loop 224, but the signs of the two flux controls 220, 240 can be chosen so that when this occurs, the rf-SQUID loop 228 remains in the non-hysteretic regime ($\beta_L<1$) (i.e., arrange signs of fluxes so that sweeping to the On state causes the magnitude of the flux in the dc-SQUID loop 224 to increase and thus further reduce BL instead of increasing it).

Spectator Effects

Figure 3A:
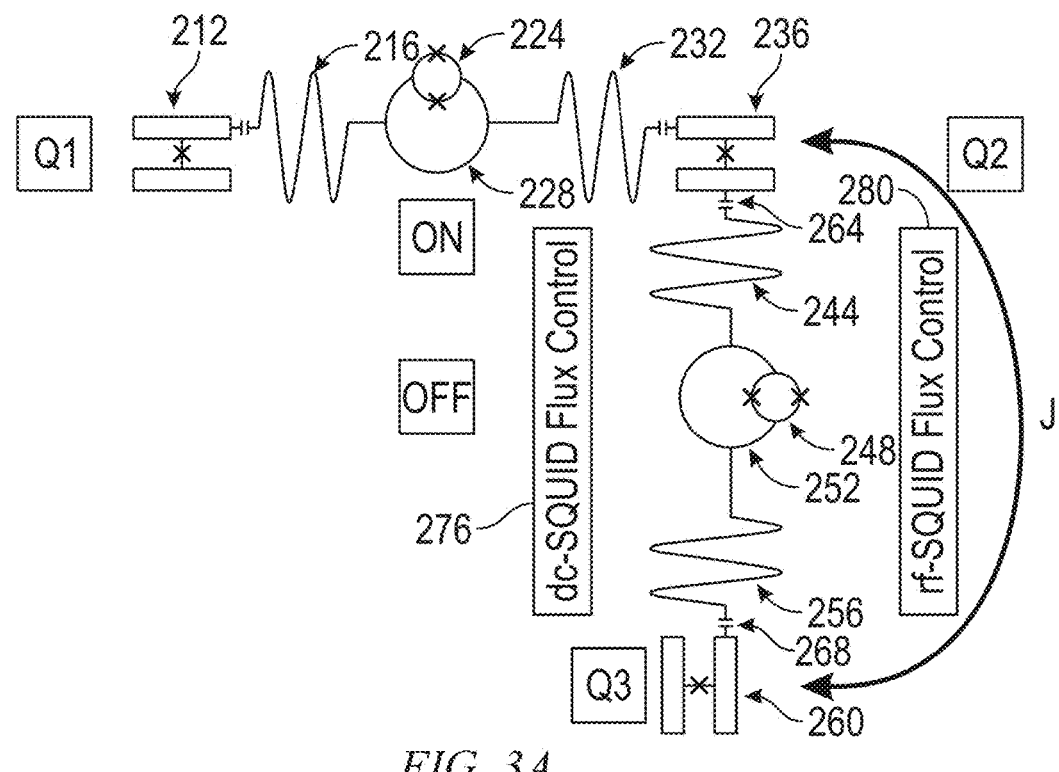
FIG. 3A illustrates a spectator qubit Q3 coupled with qubit Q2 via the double resonator coupler of FIG. 1, in accordance with an example embodiment.

FIG. 3A illustrates a spectator qubit Q3 coupled with qubit Q2 via the double resonator coupler of FIG. 1, in accordance with an example embodiment. Similar to the example double resonator coupler circuit for providing long-range interactions between qubits 212, 236, the double resonator coupler circuit of FIG. 3A includes qubit 260, resonators 244, 256, a loop 252 of an rf-SQUID and a loop 248 of a dc-SQUID. (It is noted that spectator qubits, such as qubit Q3, may also be coupled with qubit Q2 via other mechanisms. For example, in principle, use of a short-range coupler, such as a flux-tunable transmon coupler or a flux-tunable double transmon coupler, is possible.)

Figure 3B:
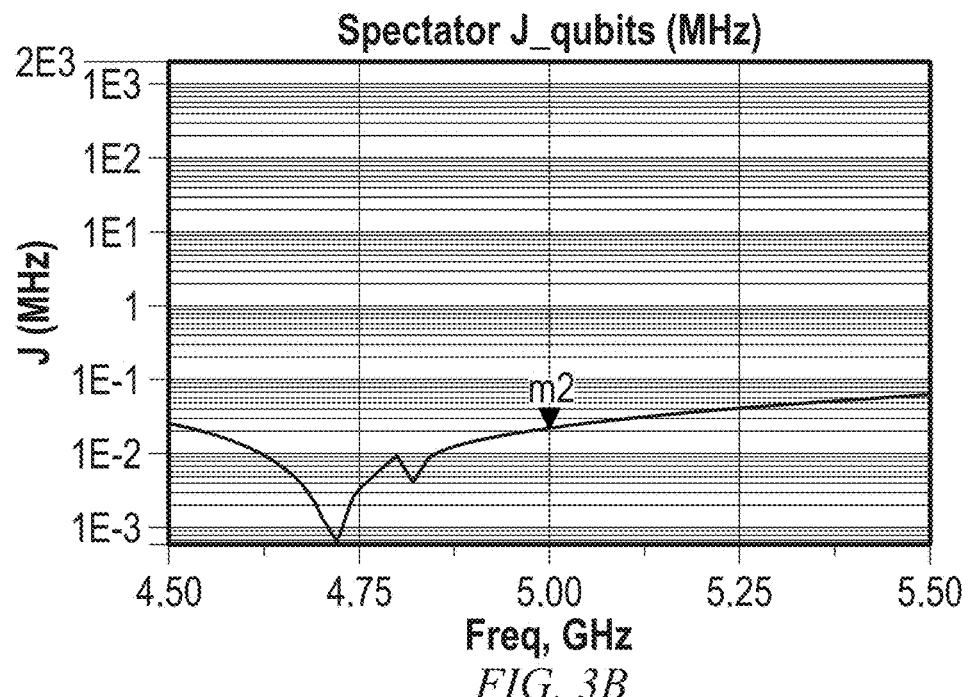
FIG. 3B illustrates the exchange coupling (J parameter) between the spectator qubit Q3 and the qubit Q2 for a range of qubit frequencies, in accordance with an example embodiment.

FIG. 3B illustrates the exchange coupling (J parameter) between the spectator qubit Q3 and the qubit Q2 for a range of qubit frequencies, in accordance with an example embodiment. The solid line shows that, when the double resonator coupler shifted to the on state, m2 is approximately 22 KHz. As illustrated in FIG. 3B, Q2 does not significantly impact spectator qubit Q3 during the On state for qubits Q1-Q2.

Figure 3C:
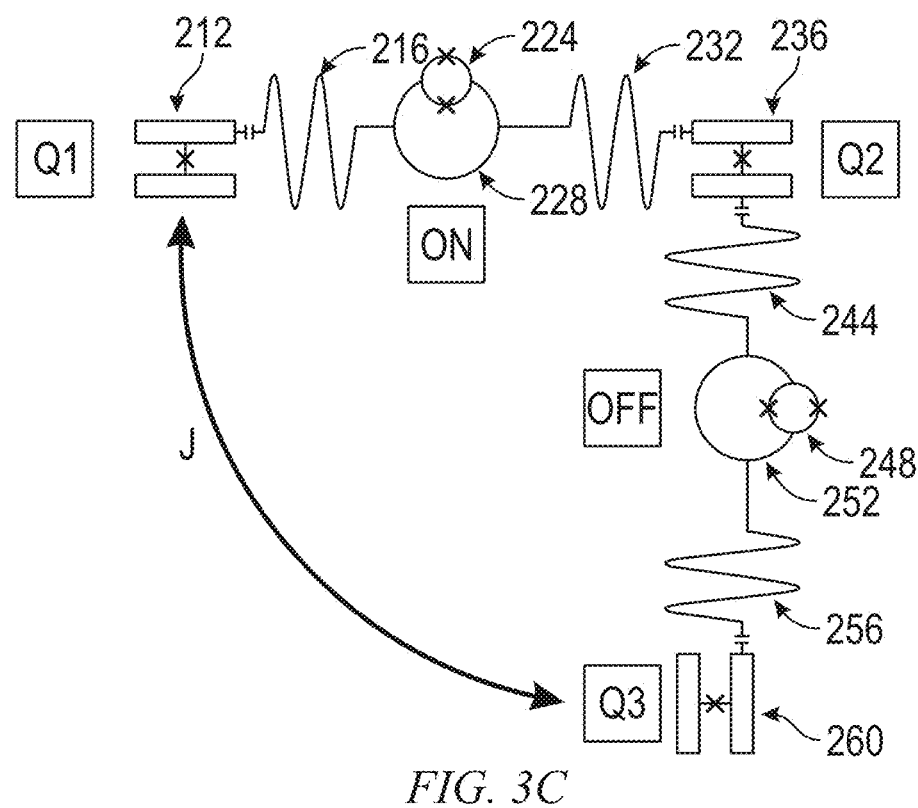
FIG. 3C highlights the next nearest neighbor interactions between qubits Q1 and Q3, in accordance with example embodiments.

FIG. 3C highlights the next nearest neighbor interactions (represented by J arrow) between qubits Q1 and Q3, in accordance with example embodiments.

Figure 3D:
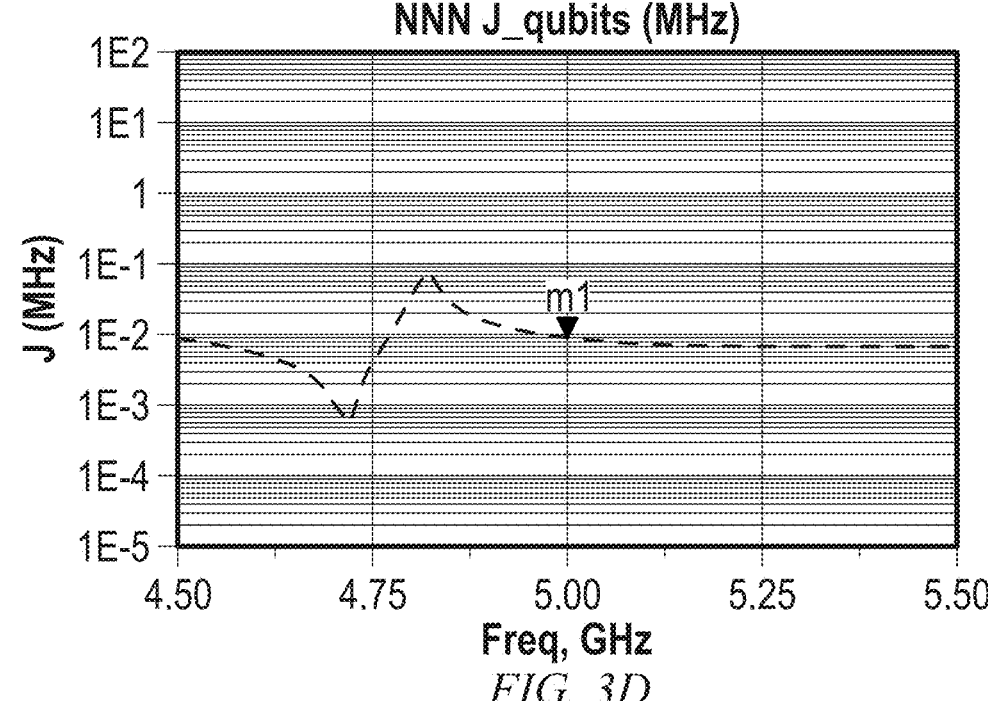
FIG. 3D illustrates the exchange coupling (J parameter) between the spectator qubit Q3 and the qubit Q1 for a range of qubit frequencies, in accordance with an example embodiment.

FIG. 3D illustrates the exchange coupling (J parameter) between the spectator qubit Q3 and the qubit Q1 for a range of qubit frequencies, in accordance with an example embodiment. As illustrated in FIG. 3D, Q1 does not significantly impact spectator qubit Q3 during the On state for qubits Q1-Q2 where, for example, m1 is less than 1 MHz and, for most frequencies, less than 100 kHz.

Refer now to FIG. 4.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as an electronic design automation tool 200 as discussed below with respect to FIG. 5. In addition to block 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 200 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer

101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Exemplary Design Process Used in Semiconductor Design, Manufacture, and/or Test

One or more embodiments make use of computer-aided semiconductor integrated circuit design simulation, test, layout, and/or manufacture. In this regard, FIG. 5 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

Figure 5:
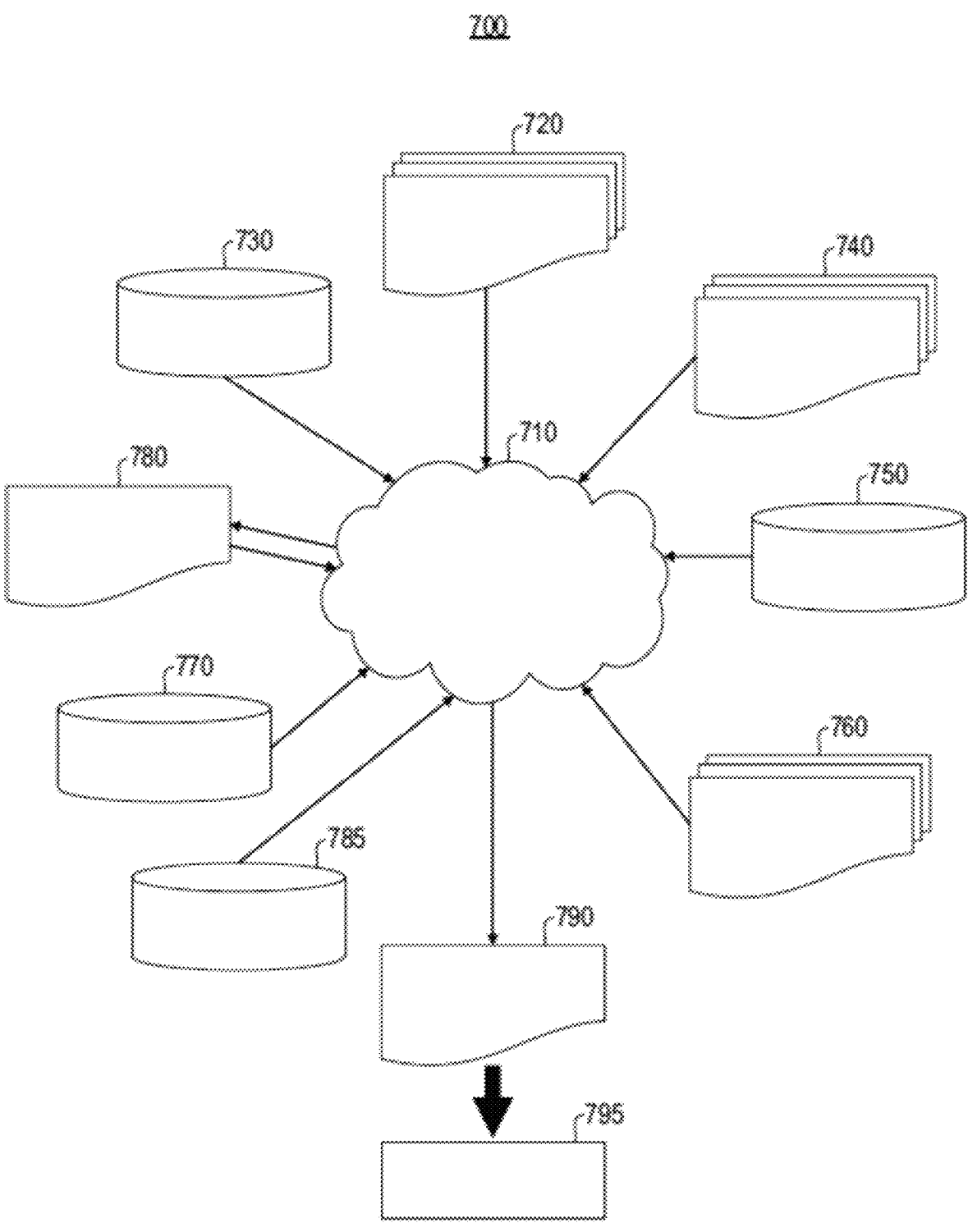
FIG. 5 is a flow diagram of a design process used in semiconductor design, manufacture, and/or test.

FIG. 5 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GLI, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A qubit interaction circuit, the qubit interaction circuit comprising:
a first qubit device;
a second qubit device;
a first resonator comprising a first terminal and a second terminal;
a second resonator comprising a first terminal and a second terminal;
a first capacitor coupling the first qubit device to the first terminal of the first resonator;
a second capacitor coupling the second qubit device to the first terminal of the second resonator;
an rf-SQUID circuit comprising an rf-SQUID loop, an rf-SQUID controller, and a de-SQUID loop, the rf-SQUID controller configured to influence a first flux of the rf-SQUID loop and the dc-SQUID loop, the rf-SQUID circuit coupling the second terminal of the first resonator with the second terminal of the second resonator; and
a dc-SQUID controller configured to influence a second flux of the rf-SQUID loop and the dc-SQUID loop.

2. The qubit interaction circuit of claim 1, wherein the rf-SQUID controller is configured to:
iteratively tune a flux of an rf-SQUID loop to $\frac{1}{2}\Phi_0$ such that an inductance of the rf-SQUID loop is cancelled out by an inductance of the dc-SQUID loop and such that an Off state between two qubit devices is attained with a non-hysteretic regime, the dc-SQUID loop and the rf-SQUID loop being coupled to the two qubit devices via a corresponding one of the first resonator and the second resonator; and
perform an additional tuning of the flux of the rf-SQUID loop such that the corresponding resonators couple and hybridize with each other, and such that an On state between the two qubit devices is attained.

3. The qubit interaction circuit of claim 1, wherein the dc-SQUID controller is configured to iteratively tune a flux of a dc-SQUID loop such that an inductance of the rf-SQUID loop is cancelled out by an inductance of the dc-SQUID loop and such that an Off state between two qubit devices is attained with a non-hysteretic regime, the dc-SQUID loop and the rf-SQUID loop being coupled to the two qubit devices via a corresponding one of the first resonator and the second resonator.

4. The qubit interaction circuit of claim 1, wherein the qubit devices are transmon qubits.

5. The qubit interaction circuit of claim 1, wherein the qubit devices are fluxonium qubits.

6. The qubit interaction circuit of claim 1, wherein the qubit devices are capacitively shunted flux qubit (CSFQ) qubits.

7. The qubit interaction circuit of claim 1, further comprising:
a third qubit device;
a third resonator;
a fourth resonator;
a third capacitor coupling the second qubit device to the third resonator;
a fourth capacitor coupling the third qubit device to the fourth resonator;
a second rf-SQUID circuit comprising a second rf-SQUID loop, a second rf-SQUID controller, and a second dc-SQUID loop, the second rf-SQUID controller being configured to influence a first flux of the second rf-SQUID loop and the second dc-SQUID loop, the rf-SQUID circuit coupling the third resonator with the fourth resonator; and
a second dc-SQUID controller configured to influence a second flux of the rf-SQUID loop and the second dc-SQUID loop.

8. The qubit interaction circuit of claim 1, further comprising a controller, the controller being coupled to the rf-SQUID flux control and the de-SQUID flux control and configured to:
iteratively tune a flux of a dc-SQUID loop and tuning a flux of an rf-SQUID loop to half of a magnetic flux quantum such that an inductance of the rf-SQUID loop is cancelled out by an inductance of the dc-SQUID loop and such that an Off state between two qubit devices is attained with a non-hysteretic regime, the dc-SQUID loop and the rf-SQUID loop being coupled to the two qubit devices via corresponding resonators; and
perform an additional tuning of the flux of the rf-SQUID loop such that the corresponding resonators couple and hybridize with each other, and such that an On state between the two qubit devices is attained.

9. The qubit interaction circuit of claim 8, the controller further configured to select a sign of a dc-SQUID controller and a sign of an rf-SQUID controller such that the flux in the rf-SQUID loop reverts to the non-hysteretic regime in response to the additional tuning of the flux of the rf-SQUID loop changing the flux in the dc-SQUID loop and thereby causing the flux in the rf-SQUID loop to revert to the hysteretic regime.

10. The qubit interaction circuit of claim 9, wherein the selection of the signs causes a magnitude of the flux in the dc-SQUID loop to increase and causes a further reduction of a screening parameter that is indicative of the non-hysteretic regime.

11. The qubit interaction circuit of claim 8, wherein the controller is further configured to tune a coupling between the corresponding resonators to zero.

12. The qubit interaction circuit of claim 8, wherein the hybridized resonators are configured such that one of a plurality of normal modes of the hybridized resonators moves up in frequency, close to that of a frequency of the two qubit devices, increasing an exchange coupling between the two qubit devices and turning on ZZ coupling between the two qubit devices.

13. The qubit interaction circuit of claim 12, wherein the controller is further configured to control ZZ between the first qubit device and the second qubit device to enable a CPHASE gate.

14. A method for tuning a qubit interaction circuit, the method comprising:

providing a qubit interaction circuit, the qubit interaction circuit comprising:

a first qubit device;

a second qubit device;

a first resonator comprising a first terminal and a second terminal;

a second resonator comprising a first terminal and a second terminal;

a first capacitor coupling the first qubit device to the first terminal of the first resonator;

a second capacitor coupling the second qubit device to the first terminal of the second resonator;

an rf-SQUID circuit comprising an rf-SQUID loop, an rf-SQUID controller, and a dc-SQUID loop, the rf-SQUID controller configured to influence a first flux of the rf-SQUID loop and the dc-SQUID loop, the rf-SQUID circuit coupling the second terminal of the first resonator with the second terminal of the second resonator; and a dc-SQUID controller configured to influence a second flux of the rf-SQUID loop and the dc-SQUID loop;

iteratively tuning a flux of the dc-SQUID loop and tuning a flux of the rf-SQUID loop to half of a magnetic flux quantum such that an inductance of the rf-SQUID loop is cancelled out by an inductance of the dc-SQUID loop and such that an Off state between two qubit devices is attained with a non-hysteretic regime, the dc-SQUID loop and the rf-SQUID loop being coupled to the two qubit devices via corresponding resonators; and performing an additional tuning of the flux of the rf-SQUID loop such that the corresponding resonators couple and hybridize with each other, and such that an On state between the two qubit devices is attained.

15. The method of claim 14, further comprising selecting a sign of the dc-SQUID controller and a sign of the rf-SQUID controller such that the flux in the rf-SQUID loop reverts to the non-hysteretic regime in response to the additional tuning of the flux of the rf-SQUID loop changing the flux in the dc-SQUID loop and thereby causing the flux in the rf-SQUID loop to revert to the hysteretic regime.

16. The method of claim 15, wherein the selection of the signs causes a magnitude of the flux in the dc-SQUID loop to increase and causes a further reduction of a screening parameter that is indicative of the non-hysteretic regime.

17. The method of claim 14, further comprising tuning a coupling between the corresponding resonators to zero.

18. The method of claim 14, wherein one of a plurality of normal modes of the hybridized resonators moves up in frequency, close to that of a frequency of the two qubit devices, increasing an exchange coupling between the two qubit devices and turning on ZZ coupling between the two qubit devices.

19. The method of claim 18, further comprising controlling ZZ between the first qubit device and the second qubit device to enable a CPHASE gate.

20. A hardware description language (HDL) design structure encoded on a non-transitory machine-readable data storage medium, the HDL design structure comprising elements that when processed in a computer-aided design system generates a machine-executable representation of a semiconductor structure, wherein the HDL design structure comprises:

a first qubit device;

a second qubit device;

a first resonator comprising a first terminal and a second terminal;

a second resonator comprising a first terminal and a second terminal;

a first capacitor coupling the first qubit device to the first resonator;

a second capacitor coupling the second qubit device to the second resonator;

an rf-SQUID circuit comprising an rf-SQUID loop, an rf-SQUID controller, and a dc-SQUID loop, the rf-SQUID controller configured to influence a first flux of the rf-SQUID loop and the dc-SQUID loop, the rf-SQUID circuit coupling the second terminal of the first resonator with the second terminal of the second resonator; and a dc-SQUID controller configured to influence a second flux of the rf-SQUID loop and the dc-SQUID loop.

* * * * *